(12) United States Patent
Guo et al.

(10) Patent No.: US 7,643,294 B2
(45) Date of Patent: Jan. 5, 2010

(54) HEAT DISSIPATING APPARATUS WITH HEAT PIPE

(75) Inventors: Qing-Lei Guo, Shenzhen (CN); Shou-Li Zhu, Shenzhen (CN); Ming Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 49 days.

(21) Appl. No.: 11/960,668

(22) Filed: Dec. 19, 2007

(65) Prior Publication Data

US 2009/0161315 A1   Jun. 25, 2009

(51) Int. Cl.
*H05K 7/20* (2006.01)
(52) U.S. Cl. .................. 361/700; 361/701; 361/702; 361/704; 165/80.5; 165/104.21; 165/104.26; 165/104.33
(58) Field of Classification Search ......... 361/699–701, 361/704–712; 165/80.2–80.5, 104.21, 104.33, 165/104.14, 181, 182, 185, 104.26
See application file for complete search history.

(56) References Cited

U.S. PATENT DOCUMENTS

| 7,331,379 | B2 * | 2/2008 | Chen et al. | 165/104.33 |
| 7,509,996 | B2 * | 3/2009 | Peng | 165/80.3 |
| 2007/0277958 | A1 * | 12/2007 | Huang | 165/80.3 |
| 2008/0202729 | A1 * | 8/2008 | Mochizuki | 165/104.14 |
| 2008/0310105 | A1 * | 12/2008 | Cheng | 361/695 |

* cited by examiner

*Primary Examiner*—Michael V Datskovskiy
(74) *Attorney, Agent, or Firm*—Frank R. Niranjan

(57) ABSTRACT

A heat dissipating apparatus includes a heat spreader (20) for thermally connecting with a heat generating electronic component, a heat sink (10) thermally connected with the heat spreader, and a heat pipe (30) thermally connecting the heat sink with the heat spreader for transferring heat from the heat spreader to the heat sink. The heat pipe includes an evaporation section (31) attached to the heat spreader, two semicircular condensation sections (33, 34) thermally engaging with the heat sink, and two connecting sections (35, 36) each interconnecting a corresponding condensation section and the evaporation section.

11 Claims, 4 Drawing Sheets

HEAT DISSIPATING APPARATUS WITH HEAT PIPE

BACKGROUND OF THE INVENTION

1. Field of the Invention

The present invention relates generally to heat dissipating apparatuses, and more particularly to a heat dissipating apparatus having a heat pipe for improving heat dissipating efficiency thereof.

2. Description of Related Art

It is well known that heat is produced by electronic components such as integrated circuit chips during their normal operations. If the heat is not timely removed, these electronic components may overheat. Therefore, heat dissipation apparatuses are often used to cool these electronic components.

Conventionally, a heat dissipation apparatus may incorporate a plurality of heat pipes. The heat dissipation apparatus further includes a base for contacting an electronic component and a plurality of fins arranged on the base. The base defines a plurality of grooves therein. The fins cooperatively define a plurality of through holes therein. Each heat pipe is generally U-shaped and has a substantially straight evaporating section received in a corresponding groove of the base, and two straight condensing sections extending upwardly from the evaporating section and received in the corresponding through holes of the fins. The heat generated by the electronic component is absorbed by the base, transferred from the base to the fins via the heat pipes, and finally dissipated from the fins to ambient air. However, in order to improve heat dissipation efficiency of the heat dissipation apparatus, the number of heat pipes used in the heat dissipation apparatus needs to be increased, which accordingly increases the cost of the heat dissipation apparatus.

What is needed, therefore, is a heat dissipation apparatus which has an excellent dissipating efficiency without increasing the number of heat pipe used therein.

SUMMARY OF THE INVENTION

A heat dissipating apparatus in accordance with a preferred embodiment includes a heat spreader for thermally connecting with a heat generating electronic component, a heat sink thermally connected with the heat spreader, and a heat pipe thermally connecting the heat sink with the heat spreader for transferring heat from the heat spreader to the heat sink. The heat pipe includes an evaporation section attached to the heat spreader, two semicircular condensation sections thermally engaging with the heat sink, and two connecting sections each interconnecting a corresponding condensation section and the evaporation section.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
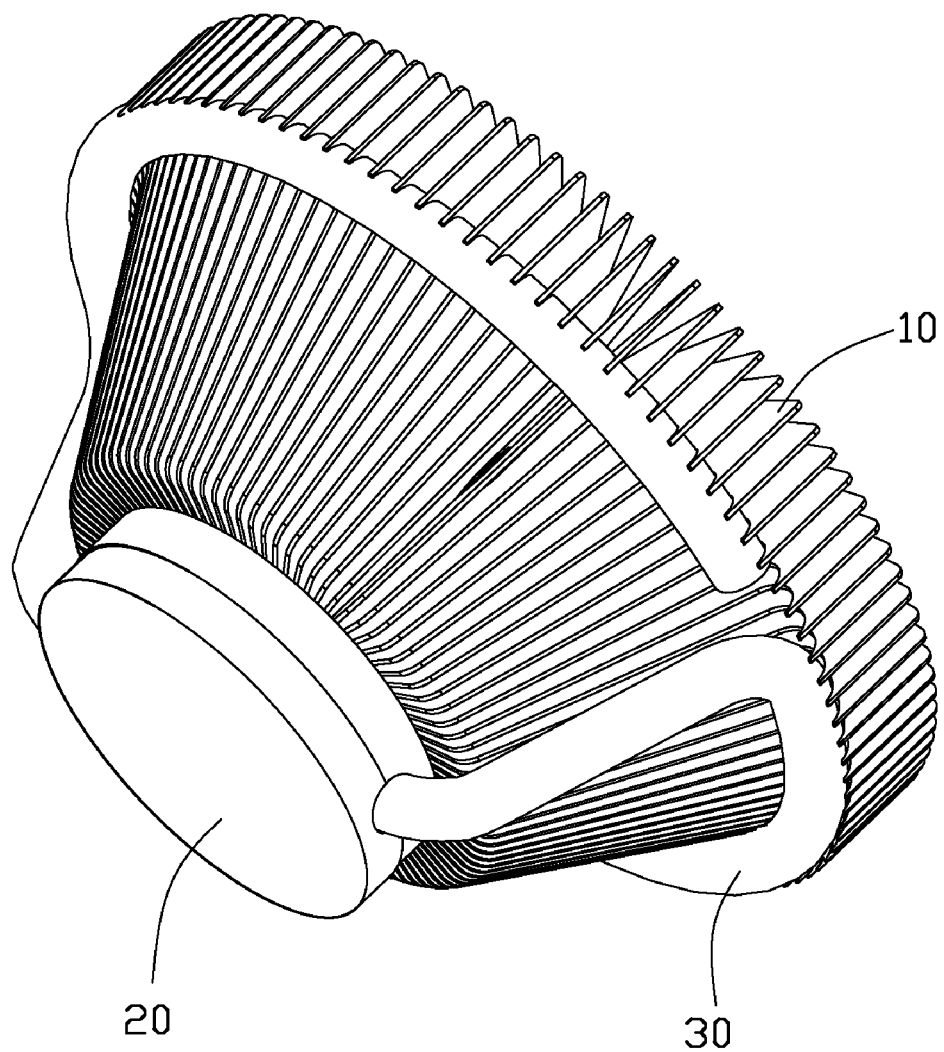
FIG. 1 is an assembled, isometric view of a heat dissipating apparatus with a heat pipe in accordance with a preferred embodiment of the present invention.

Referring to FIG. 1, a heat dissipating apparatus in accordance with a preferred embodiment of the present invention includes a heat sink 10, a heat spreader 20 for thermally connecting with a heat generating electronic component (not shown) and a heat pipe 30 for transferring heat from the heat spreader 20 to the heat sink 10.

Figure 2:
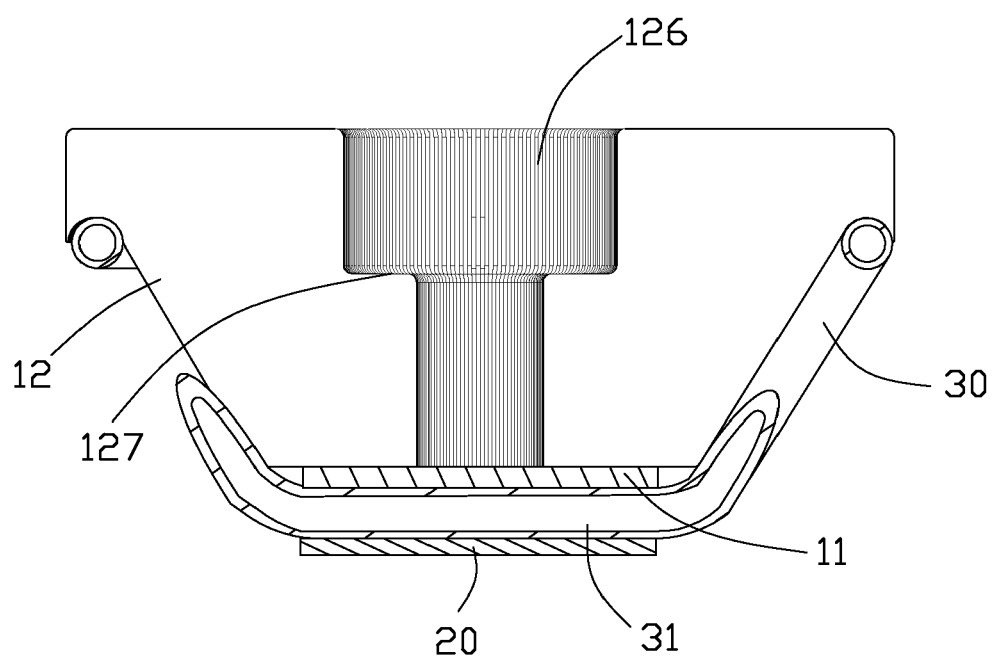
FIG. 2 is a cross-sectional view of the heat dissipating apparatus of FIG. 1.
Figure 3:
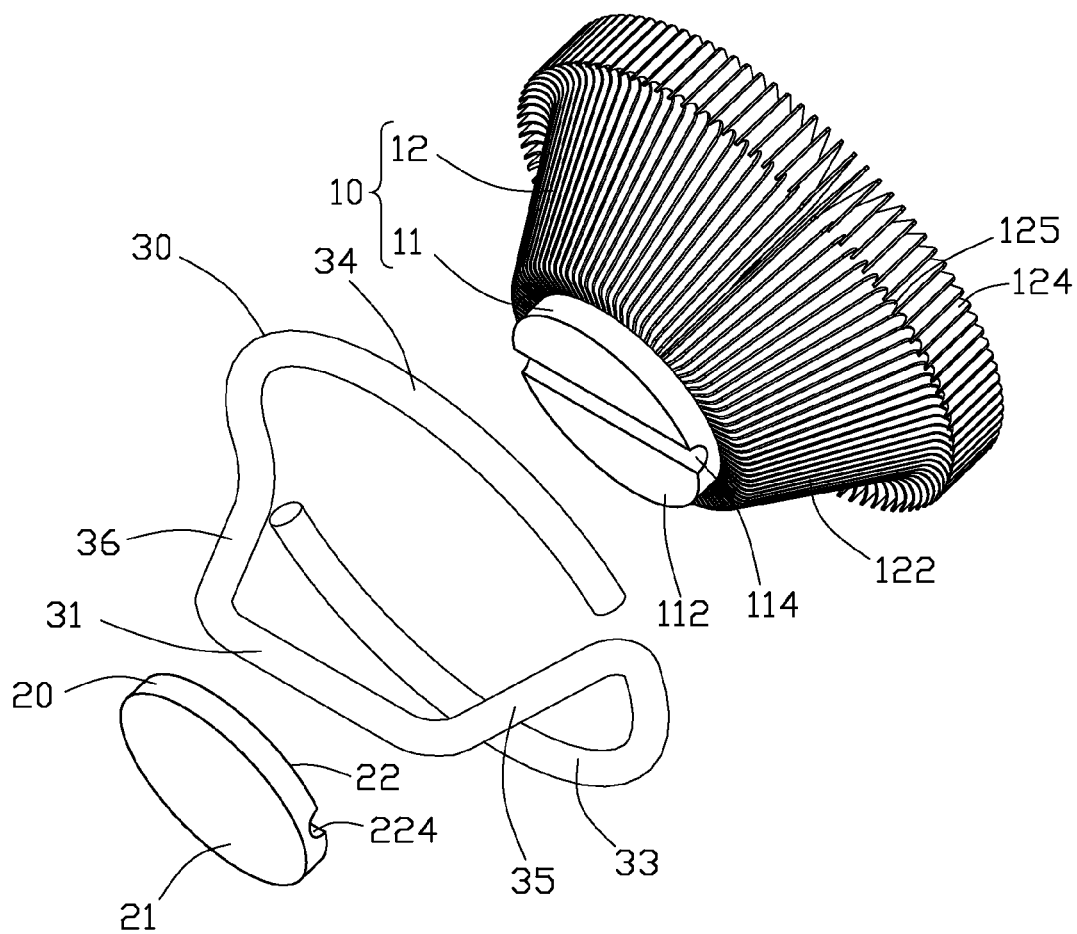
FIG. 3 is an exploded, isometric view of the heat dissipating apparatus of FIG. 1.

Also referring to FIGS. 2 and 3, the heat sink 10 has a bowl shape. The heat sink 10 includes a base 11 and a plurality of fins 12 radially connecting with the base 11. The base 11 has a circular shape and is made of thermal conductive material, such as copper, aluminum and so on. The base 11 has a bottom face 112 with a semicircular groove 114 to receive a portion of the heat pipe 30 therein.

Each of the plurality of fins 12 includes a lower part 122 having a radial length gradually increasing upwardly, and an upper tab 124 extending upwardly and outwardly from a top of the lower part 122. The upper tab 124 of each fin 12 is radially longer than the lower part 122, for increasing heat dissipating areas of the heat sink 10 as much as possible. An annular recess 125 is defined around a bottom surface of the upper tab 124 to receive another portion of the heat pipe 30 therein. The plurality of fins 12 are integrally formed with the base 11 as a single piece. Alternatively, the fins 12 can be separately formed and attached to the base 11 thereafter. A central hole 126 (shown in FIG. 2) is defined at a position between inner surfaces of the plurality of fins 12 so as to be convenient to manufacture the plurality of fins 12. The central hole 126 may also be used to accommodate a cooling fan therein for providing airflow through the fins 12. A bottom diameter of the central hole 126 is smaller than a top diameter of the central hole 126 so that a step 127 is formed on the inner surface of each fin 12.

The heat spreader 20 has a bottom face 21 for contacting the heat generating electronic component to absorb heat therefrom, and a top face 22 with a semicircular grooves 224 corresponding to the groove 114 of the base 11 of the heat sink 10. The heat spreader 20 has a circular shape and is made of thermal conductive material, such as copper, aluminum and so on.

Figure 4:
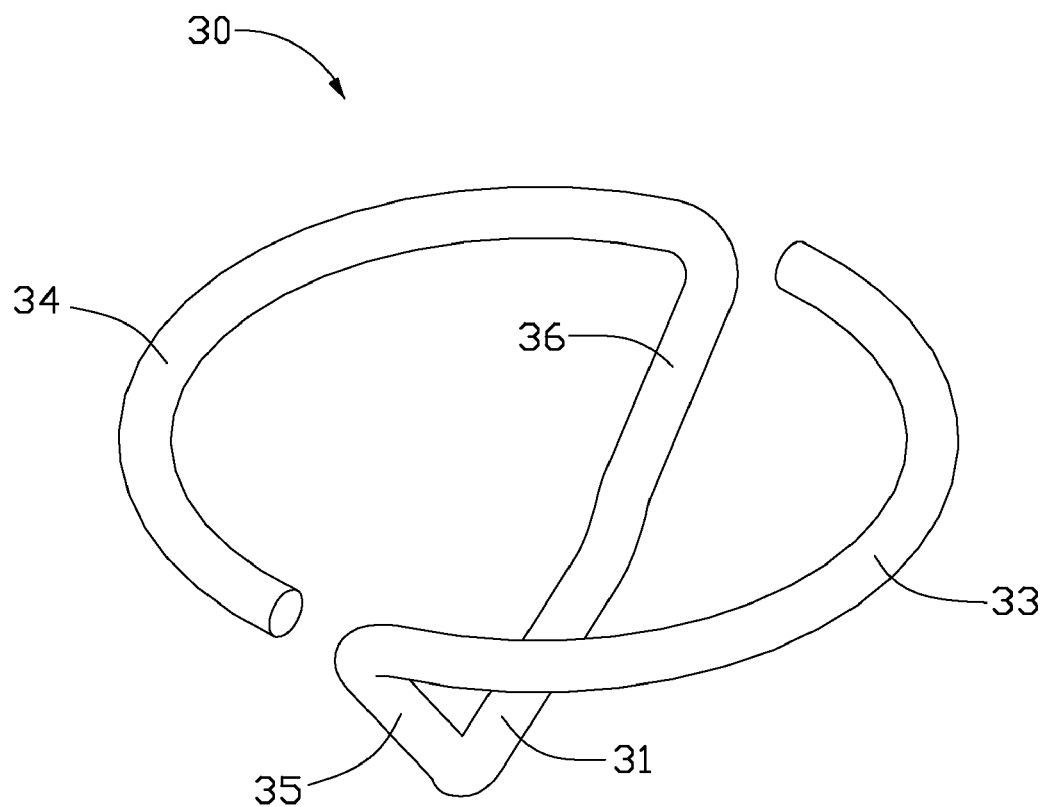
FIG. 4 is an isometric view of the heat pipe of the heat dissipating apparatus of FIG. 1, as viewed from another aspect.

Referring to FIG. 4, the heat pipe 30 is substantially steering wheel shaped. The heat pipe 30 includes an evaporation section 31, two condensation sections 33, 34 and two connecting sections 35, 36 each interconnecting a corresponding condensation section 33, 34 and the evaporation section 21. The two connecting sections 35, 36 extend upwardly and outwardly and slantwise from opposite ends of the evaporation section 21, respectively. An acute angle is formed between the connecting sections 35, 36, and an obtuse angle is formed between each of the connecting sections 35, 36 and the evaporation section 21 for being coincidental with an outer periphery of the heat sink 10. The two condensation sections 33, 34 extend respectively from free ends of the two connecting sections 35, 36 along a circular, clockwise direction. The two condensation sections 33, 34 each are semicircular and located substantially in a horizontal coplanar surface with each other. The plane defined by the two condensation sections 33, 34 is substantially parallel to the base 11.

Referring back to FIGS. 1-3, the evaporation section 31 of the heat pipe 30 is received in the groove 114 of the base 11, and the condensation sections 33, 34 of the heat pipe 30 is thermally received in the annular recess 125 of the fins 12, with the connecting sections 35, 36 of the heat pipe 30 closely attached to an outer surface of the lower part 122 of each of the fins 12. The top face 22 of the heat spreader 20 is closely and thermally attached to the bottom face 112 of the base 11, with the evaporation section 31 of the heat pipe 30 also being received in the groove 224 of the heat spreader 20.

In use, the heat spreader 20 absorbs heat from the heat generating electronic component to which the heat spreader 20 is attached. A portion of the heat in the heat spreader 20 is absorbed by the evaporation section 31 of the heat pipe 30 and is then transferred to the condensation sections 33, 34 of the heat pipe 30. Then, the condensation sections 33, 34 release that portion of heat to the fins 12. Other portion of the heat in the heat spreader 20 is directly transferred to the base 11 then to the fins 12 of the heat sink 10. The heat in the fins 12 is subsequently dissipated to ambient air.

In the present embodiment, since the heat pipe 30 has two semicircular and coplanar condensation sections 33, 34 thermally connecting with the fins 12, the heat pipe 30 can functionally equal to two U-shaped heat pipes regarding heat dissipating efficiency. Thus, the heat pipe 30 can enhance the heat dissipating efficiency of the heat dissipation apparatus without increasing the number of heat pipes. Accordingly, cost of the heat dissipation apparatus can be lowered, in comparison with a conventional heat dissipation apparatus having multiple heat pipes.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipating apparatus for removing heat from a heat generating electronic component, the heat dissipating apparatus comprising:
    a heat spreader for thermally connecting with the heat generating electronic component;
    a heat sink thermally connected with the heat spreader; and
    a heat pipe thermally connecting the heat sink with the heat spreader for transferring heat from the heat spreader to the heat sink, the heat pipe comprising an evaporation section attached to the heat spreader, two semicircular condensation sections thermally engaging with the heat sink, and two connecting sections each interconnecting a corresponding condensation section and the evaporation section;
    wherein the heat sink has a plurality of fins, each fin having a lower part and an upper tab extending upwardly and outwardly from a top of the lower part, a recess being defined around a bottom surface of the upper tab to receive the condensation sections of the heat pipe therein.

2. The heat dissipating apparatus as claimed in claim 1, wherein the two connecting sections of the heat pipe extend upwardly from opposite ends of the evaporation section, respectively.

3. The heat dissipating apparatus as claimed in claim 2, wherein the two connecting sections of the heat pipe are at an acute angle to each other.

4. The heat dissipating apparatus as claimed in claim 1, wherein the two condensation sections extend respectively from free ends of the two connecting sections along a circular direction.

5. The heat dissipating apparatus as claimed in claim 1, wherein a plane defined by the two condensation sections is substantially parallel to the heat spreader.

6. The heat dissipating apparatus as claimed in claim 1, wherein the lower part has a radial length gradually increasing upwardly, and the upper tab is radially longer than the lower part.

7. The heat dissipating apparatus as claimed in claim 1, wherein a central hole is defined at a position between inner surfaces of the plurality of fins.

8. The heat dissipating apparatus as claimed in claim 7, wherein the heat sink further comprises a base thermally engaging with the heat spreader, the base and the heat spreader each defining a groove for cooperatively receiving the evaporation section of the heat pipe therein.

9. The heat dissipating apparatus as claimed in claim 8, wherein the fins are integrally formed with the base as a single piece.

10. A heat dissipating apparatus comprising:
    a heat sink including a plurality of metal fins arranged radially and outwardly from a central axis of the heat sink; and
    a heat pipe including an evaporation section adapted for thermally connecting with an electronic component, two semicircular condensation sections thermally attached to upper portions of the metal fins along a circular direction of the heat sink, and two connecting sections each interconnecting a corresponding condensation section with the evaporation section;
    wherein the two semicircular condensation sections are attached to an outer circumferential surface of the heat sink; and
    wherein the heat sink defines an annular groove at the upper portions of the metal fins, and the two semicircular condensation sections are received in the groove.

11. The heat dissipating apparatus as claimed in claim 10, wherein the two semicircular condensation sections are located at a higher level than the evaporation section.

* * * * *